(12) United States Patent
Helms et al.

(10) Patent No.: US 8,918,068 B1
(45) Date of Patent: Dec. 23, 2014

(54) WIDE BANDWIDTH RF POWER LIMITER

(75) Inventors: David R. Helms, Tyngsboro, MA (US); Dana J. Sturzebecher, Cary, NC (US)

(73) Assignee: Lockheed Martin Corporation, Bethesda, MD (US)

( * ) Notice: Subject to any disclaimer, the term of this patent is extended or adjusted under 35 U.S.C. 154(b) by 312 days.

(21) Appl. No.: 13/349,123

(22) Filed: Jan. 12, 2012

(51) Int. Cl.
*H03C 1/52* (2006.01)

(52) U.S. Cl.
USPC .............. 455/108; 455/402; 315/291; 330/10

(58) Field of Classification Search
CPC ................................ H03G 1/025; H03G 11/04
See application file for complete search history.

(56) References Cited

U.S. PATENT DOCUMENTS

| | | | | |
|---|---|---|---|---|
| 5,714,900 A | * | 2/1998 | Ehlers | 327/325 |
| 7,009,462 B2 | * | 3/2006 | Kojima | 333/17.2 |
| 2009/0322442 A1 | * | 12/2009 | Maas | 333/17.2 |

* cited by examiner

*Primary Examiner* — Temesgh Ghebretinsae
*Assistant Examiner* — Richard Chan
(74) *Attorney, Agent, or Firm* — Howard IP Law Group, PC.

(57) ABSTRACT

A radio frequency (RF) power limiter including a signal conductor having an input end and an output end and first and second limiter stages. The first limiter stage comprises a plurality of stacked diode strings arranged in anti-parallel with respect to the signal conductor. The second limiter stage comprises a second plurality of stacked diode strings arranged in anti-parallel with respect to the signal conductor. An all pass filter is arranged between the first and second limiter stages.

15 Claims, 5 Drawing Sheets

WIDE BANDWIDTH RF POWER LIMITER

FIELD OF THE INVENTION

The present invention relates to limiting circuits, and more specifically to radio frequency (RF) power limiting circuits used, for example, in communications and radar systems.

BACKGROUND

RF power limiters are often employed in various electronic devices to block sensitive circuit components from excess RF power. This may be especially critical in applications such as radio/radar transceivers, wherein transmitter and receiver hardware share a common antenna. More specifically, RF receivers generally include input circuitry comprising sensitive components, such as low-noise amplifier stages, in order to capture relatively weak signals. These components may be damaged by excessively high-powered input signals received from, for example, short-range radar returns as well as the coupling of transmitter output to the receiver's input by antenna reflection and leakage. Further, existing RF power limiters in high-power RF environments typically operate over only a narrow bandwidth, and display significant leakage which may result in damage to these sensitive components. These low-noise amplifiers also cannot be implemented in optimal size due at least in part to their excessive power leakage. For example, when subject to high input power, a low-noise amplifier may leak too much drive power for subsequent stages (e.g. a subsequent drive amplifier). This excess power must be controlled.

Alternative systems and methods are desired for improving RF power limiting over a wide bandwidth, reducing in power leakage, as well as improving packaging and production capabilities.

SUMMARY

According to one embodiment of the present invention, a distributed, two-stage signal amplitude limiter is provided. The limiter comprises a first set and a second set of anti-parallel stacked diode strings arranged along a signal conductor. An all-pass network is provided along the signal conductor between the first and second sets of anti-parallel stacked diode strings. The all pass network comprises, for example, a first and second inductor arranged in series along the signal conductor, and a third inductor arranged in shunt between the first and second inductors.

According to another embodiment, an RF receiver is provided and responsive to an antenna for transducing unguided RF signals into guided signals. The receiver includes a low-noise amplifier having an input port and an output port, and a second amplifier stage having a second amplifier input port for amplifying a signal applied thereto. A first signal amplitude limiter is coupled to the receiver input port and to the input port of the low-noise amplifier for limiting the amplitude of the signal applied to the input port of the low-noise amplifier. A second signal amplitude limiter is coupled to the output port of the low-noise amplifier and to the second amplifier input port for limiting the amplitude of the signal applied to the second amplifier stage.

DETAILED DESCRIPTION

Figure 1:
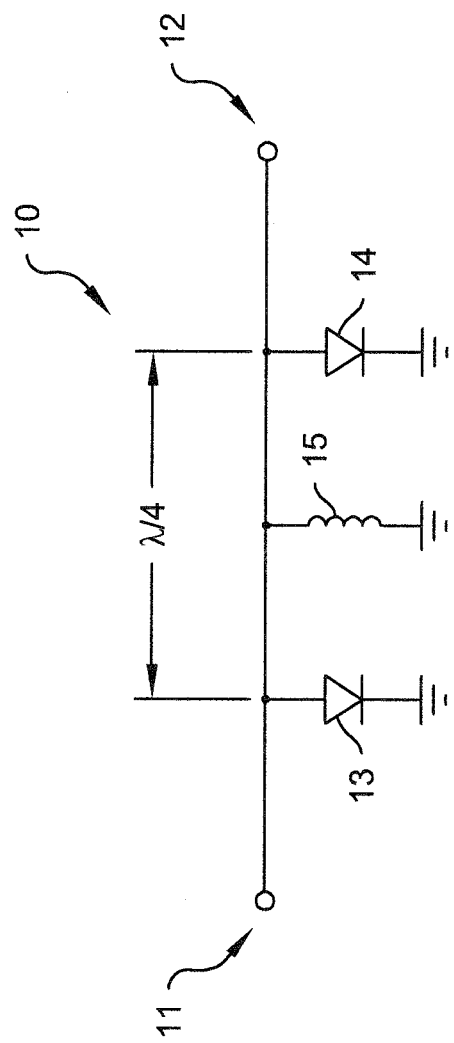
FIG. 1 is circuit diagram of a conventional two-stage RF power limiter according to the prior art.

It is to be understood that the figures and descriptions of the present invention have been simplified to illustrate elements that are relevant for a clear understanding of the present invention, while eliminating, for purposes of clarity, many other elements found in RF circuits, including RF power-limiting circuits and RF receivers. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

FIG. 1 illustrates a conventional two-stage limiter 10 used for RF power limiting. Limiter 10 comprises a first RF limiter stage having an input port 11 for receiving an RF input signal (not shown). The first stage comprises a first diode 13 and an RF choke inductor 15 arranged in shunt. The second stage of the limiter includes a second diode 14 arranged about one-quarter wavelength from diode 13 of the first limiter stage. Limiter 10 functions in a conventional manner. In operation, the absence of a sufficiently-large input signal leaves the impedance of diodes 13,14 at a maximum, minimizing insertion loss and allowing an input signal to pass largely unregulated to an output port 12. However, the presence of an input signal of sufficient magnitude switches diodes 13,14 to a low impedance state, reflecting the majority of the input signal back to its source.

Figure 2:
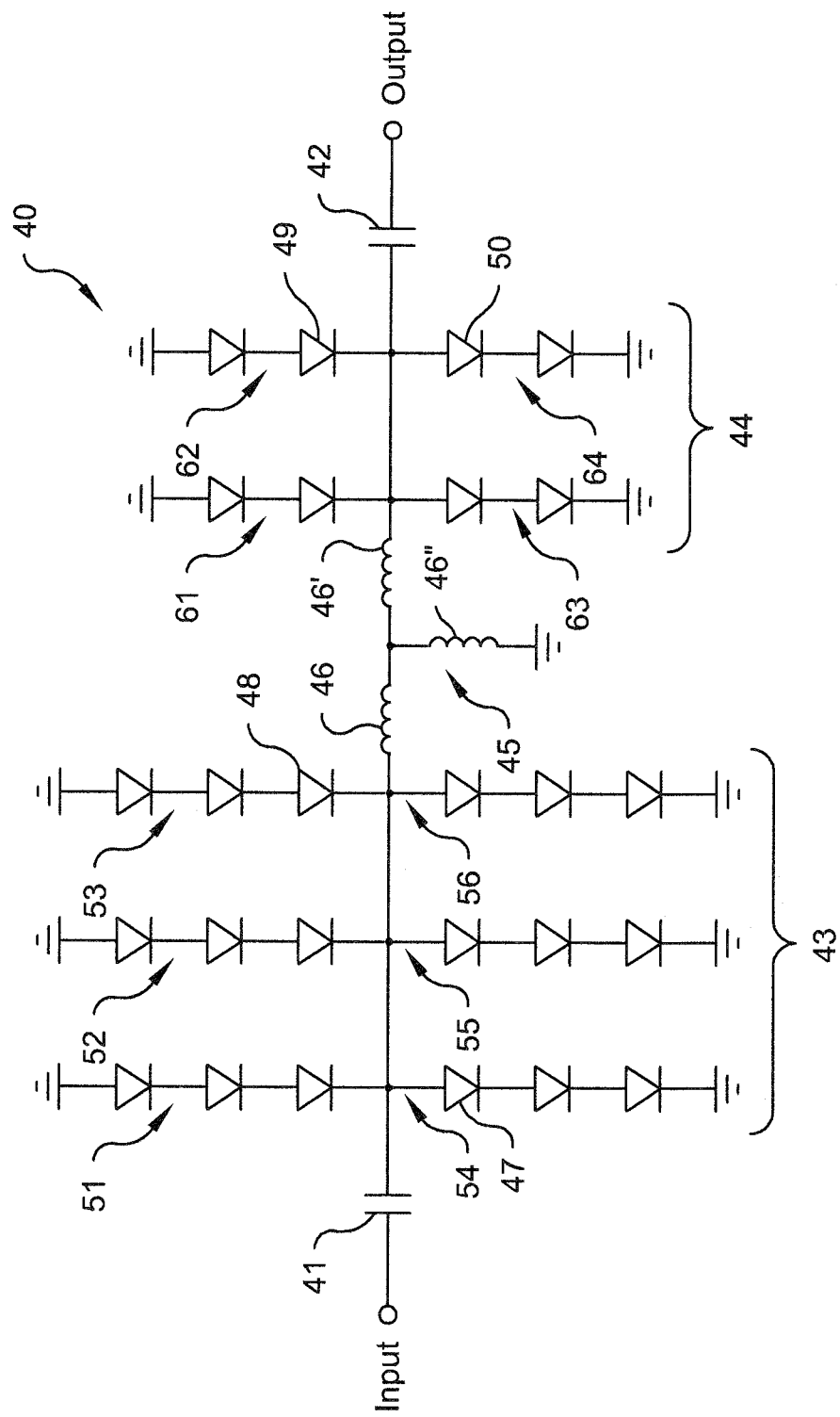
FIG. 2 is a circuit diagram of a two-stage RF power limiter according to an embodiment of the present invention.

Referring generally to FIG. 2, an RF limiter 40 according to an embodiment of the present invention is shown. Limiter 40 comprises a distributed multi-stage limiter. In the exemplary embodiment, limiter 40 includes a first limiter stage 43 and a second limiter stage 44. Limiter stage 43 comprises a plurality of stacked diode strings arranged in anti-parallel with respect to the primary signal conductor. As shown, limiter stage 43 includes a plurality (e.g. 6) of series-stacked diode strings including strings 51,52,53 having respective cathodes of each diode 48 responsive to the signal conductor. Likewise, arranged anti-parallel to strings 51,52,53 is a corresponding set of strings 54,55,56 of stacked diodes 47.

Second limiter stage 44 includes a plurality (e.g. 4) of series-stacked diode strings including strings 61,62 having respective cathodes of each diode 49 responsive to the signal conductor. Likewise, corresponding strings 63,64 of stacked diodes 50 are arranged in anti-parallel to strings 61,62. In the exemplary embodiment, DC blocking capacitors 41,42 may be arranged at the input and output of the circuit, respectively.

It is envisioned that second limiter stage 44 may be configured to function as an exciter for first limiter stage 43. More specifically, when limiter 40 is subject to a sufficiently-large input signal, the impedance of second limiter stage 44 is designed to change from high to low prior to the changing of first limiter stage 43. This generates a standing wave on the signal conductor which accelerates the change in impedance of first limiter stage 43.

The spaced diode strings of first and second limiter stages 43,44 provide several advantages over arrangements of the prior art. By distributing the diodes down the length of the signal conduction path, the performance of the limiter is significantly enhanced. For example, this distributing or spacing results in a lower power threshold (e.g. 95 milliwatts (mW)) and a lower power leakage (e.g. 20 mW) compared to grouped or lumped limiter arrangements typically having a threshold of around 400 mW and a leakage power of around 800 mW. Moreover, stacking the diodes on the input in series improves heat distribution, ensuring junction temperatures remain in their ideal operating range, while increasing the capacity of the device.

Unlike conventional limiters which utilize a quarter-wave transmission line between limiter stages, embodiments of the present invention include, for example, a matched all pass filter or network 45. All pass filter 45 includes inductors 46,46' arranged in series along the signal conductor, and a shunt inductor 46" arranged therebetween. In one embodiment of the present invention, all pass filter 45 may be tuned in conjunction with the shunt capacitance of the diodes to induce a phase shift of, for example, 90 degrees from the input to the output of the limiter. This phase shift is maintained over a wide bandwidth, as distinct from a pass band arrangement, which has a varying phase over the operating band. Shunt inductor 46" may be configured to reflect low-frequency signals back out the input, and to discharge the diodes. This discharge may be accomplished in one RF cycle, resulting in a response time in nanoseconds versus micro or milliseconds in arrangements of the prior art.

Diodes 47-50 of embodiments of the present invention may comprise Schottky diodes, including Schottky ESD (electrostatic discharge) diodes. It should be understood that the use of Schottky ESD diodes may necessitate the elimination of, for example, capacitor 41 in order to facilitate the limiter's ability to protect against ESD and lighting strikes. In addition to providing wide-band operation, Schottky diodes may be formed by conventional integrated circuit construction techniques, unlike the PIN diodes used in limiters of the prior art.

For example, embodiments of the present invention may include an RF limiter formed on an integrated circuit along with a low-noise amplifier. In one embodiment, the amplifier and limiter may be formed as a monolithic microwave integrated circuit (MMIC). Exemplary MMIC construction materials include gallium arsenide (GaAs), a low-loss dielectric material especially suitable for fabricating the Schottky diode-based limiters of embodiments of the present invention. Moreover, incorporating Schottky ESD diodes onto the same integrated circuit chip as the amplifier reduces power leakage (e.g. 2.5 mW) compared to the leakage from an arrangement incorporating a traditional PIN diode-based limiter (e.g. 13 mW).

Figure 3:
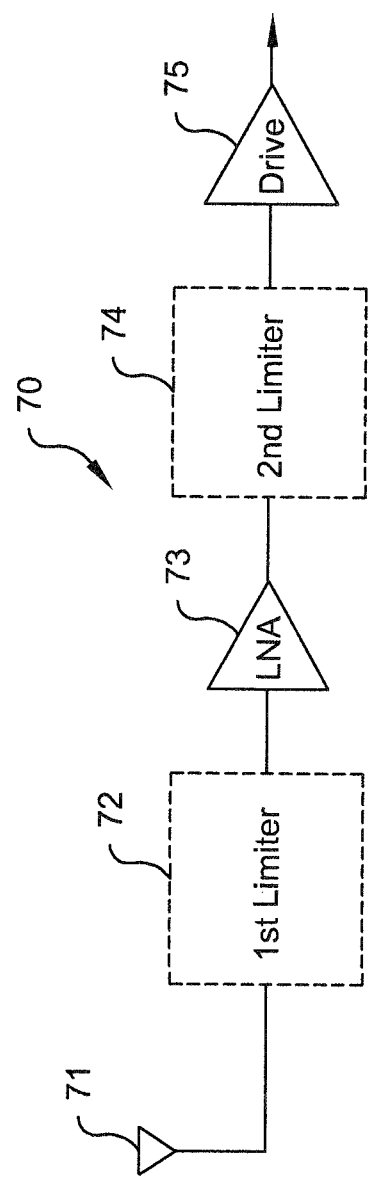
FIG. 3 is a partial block diagram of an exemplary receiver implementing first and second power limiters according to an embodiment of the present invention.
Figure 4:
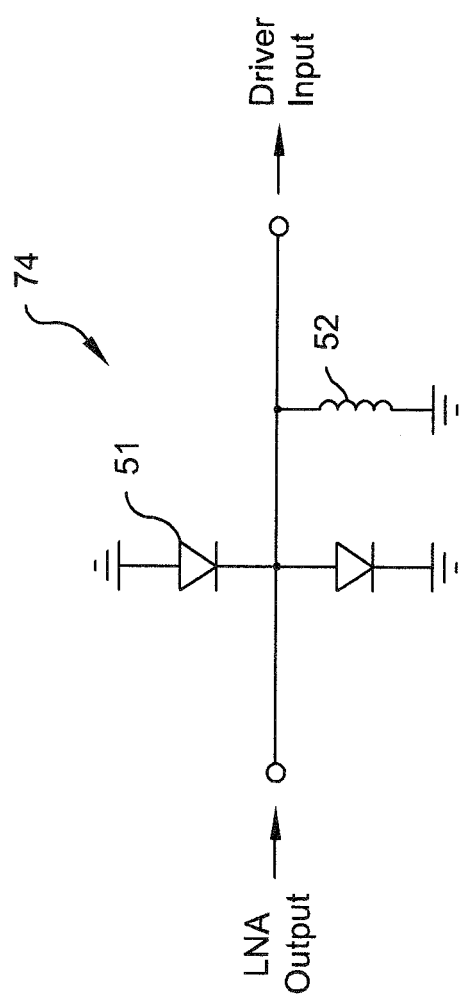
FIG. 4 is a partial circuit diagram of an exemplary second power limiter which may be used in the receiver of FIG. 3.

Further still, the use of Schottky ESD diodes in a stacked arrangement reduces parasitic capacitance, and thus insertion losses. This capacitance is distributed as a result of the spacing between diode strings, allowing for approximately DC to 5 GHz band width at 0.25 dB loss, compared to a PIN diode's loss of about 0.5 dB covering from roughly 1-5 GHz. The use of Schottky diodes in anti-parallel provides attenuation of both the positive and the negative swing of the RF signal. Because of the nature of PIN diodes, anti-parallel diode placement in conjunction with an amplifier may not be possible As set forth above, low-noise amplifiers used in the front ends of RF receivers often require protection from excessively high-powered input signals which may damage their sensitive components. Likewise, their size is often limited by output power leakage which would be too large for subsequent signal processing stages, such as drive amplifier stages. Referring generally to FIG. 3, a partial block diagram of an exemplary receiver incorporating a limiter according to embodiments of the present invention is provided. Receiver 70 includes a low-noise amplifier 73 and a drive amplifier 75 responsive to input signals received from an antenna 71. In the exemplary embodiment, a first limiter 72 is provided between the output of antenna 71 and the input of low-noise amplifier 73. Limiter 72 may comprise similar construction to limiter 40 of FIG. 2, and protects low-noise amplifier 73 from, for example, the above-described high power input associated with leakage and high-powered input signals. A second, or inter-stage limiter 74 according to embodiments of the present invention is arranged between low-noise amplifier 73 and drive amplifier 75 to regulate power provided to drive amplifier 75. Referring generally to FIG. 4, this second limiter 74 may comprise, for example, one or more diode strings having an anti-parallel arrangement. In the exemplary embodiment, limiter 74 comprises two anti-parallel diodes 51 and an RF choke inductor 52.

Figure 5:
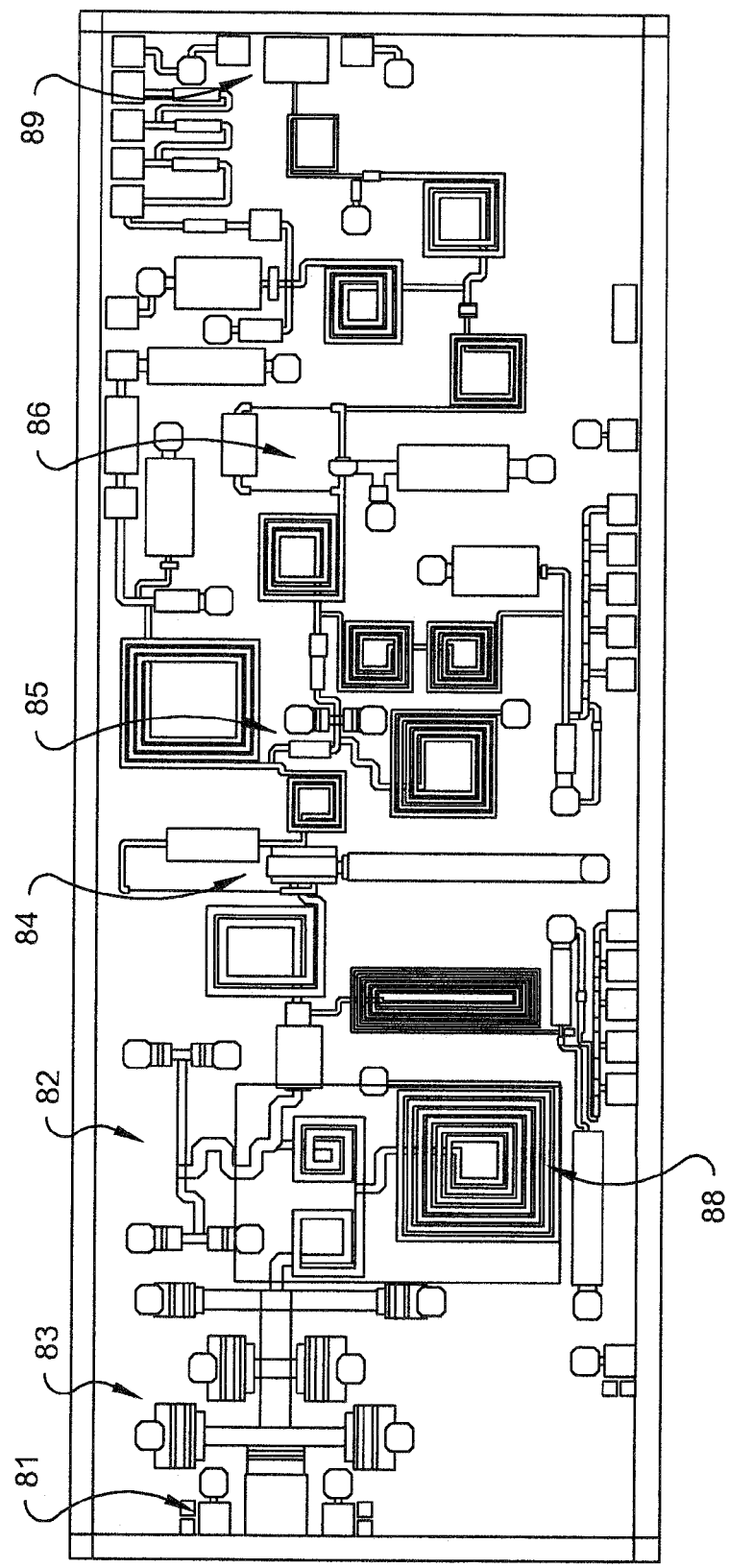
FIG. 5 is a schematic diagram of the receiver of FIG. 3 implemented as a monolithic microwave integrated circuit (MMIC).

FIG. 5 includes a receiver arrangement similar to that of FIG. 3, implemented into an integrated circuit. As described above, limiters according to embodiments of the present invention may be packaged with one or more of the amplifiers as a single MMIC chip. Receiver 80 of FIG. 5 comprises an MMIC circuit including an RF input 81 and output 89. A first two stage power limiter (e.g. limiter 72 of FIG. 3) is provided similar to that set forth above with respect to FIG. 2. The first limiter comprises a first limiter stage 83 and a second limiter stage 82 with an all pass filter 88 arranged therebetween. As set forth above, second limiter stage 82 may function as an exciter stage for first limiter stage 83. The first limiter is arranged in series with a low-noise amplifier 84, followed by a second limiter 85 (e.g. limiter 74 of FIG. 3) and a drive amplification stage 86. Formation of the limiter stages and amplifier stages on a single integrated circuit assembly simplifies packaging and reduces power leakage compared to circuits formed by a plurality of discrete components.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A limiter circuit comprising:
a signal conductor having an input end and an output end;
a first limiter stage comprising a plurality of stacked diode strings arranged in anti-parallel with respect to the signal conductor;
a second limiter stage comprising a second plurality of stacked diode strings arranged in anti-parallel with respect to the signal conductor, and
an all pass filter arranged between the first and second limiter stages, the all pass filter including a first and second inductor arranged in series along the signal conductor, and a third inductor arranged in shunt between the first and second inductors.

2. The limiter of claim 1, wherein the number of diodes in the anti-parallel stacked diode strings of the first stage exceeds the number of diodes in the anti-parallel stacked diode strings of the second stage.

3. The limiter of claim 2, wherein the plurality of stacked diode strings of the first limiter stage comprises six stacked diode strings.

4. The limiter of claim 3, wherein each stacked diode string of the first limiter stage comprises three diodes.

5. The limiter of claim 4, wherein the plurality of stacked diode strings of the second limiter stage comprises four stacked diode strings.

6. The limiter of claim 5, wherein each stacked diode string of the second limiter stage comprises two diodes.

7. The limiter of claim 1, wherein each stacked diode string of the first limiter stage and the second limiter stage comprises Schottky diodes.

8. The limiter of claim 7, wherein the Schottky diodes are Schottky ESD diodes.

9. The limiter of claim 1, wherein the all pass filter induces a 90° phase shift.

10. The limiter of claim 1, wherein the limiter is formed as a monolithic microwave integrated circuit (MMIC).

11. A receiver arrangement comprising:
an antenna for transducing radio-frequency (RF) signals into guided signals;
a low-noise amplifier including an input port and an output port;
a first signal amplitude limiter coupled to the receiver input port and to the input port of the low-noise amplifier for limiting the amplitude of the signal applied to the input port of the low-noise amplifier;
a second amplifier including a second amplifier input port for amplifying signal applied to the second amplifier input port; and
a second signal amplitude limiter coupled to the output port of the low-noise amplifier and to the second amplifier input port for limiting the amplitude of signal applied to the second amplifier,
wherein the first signal amplitude limiter comprises:
at least first and second anti-parallel stacked diode strings, the number of diodes in the first anti-parallel stacked diode string exceeding the number of diodes in the second anti-parallel stacked diode string; and
an all pass filter extending between the first and second anti-parallel stacked diode strings, the all pass filter including a first and second inductor arranged in series along the signal conductor, and a third inductor arranged in shunt between the first and second inductors.

12. A receiver arrangement according to claim 11, wherein the all pass filter induces a 90° phase shift.

13. A receiver arrangement according to claim 11, wherein the second limiter comprises a plurality of diodes arranged in anti-parallel.

14. A receiver arrangement according to claim 11, wherein the reference potential is ground potential.

15. A receiver arrangement according to claim 11, wherein the low-noise amplifier, the first signal amplitude limiter, the second amplifier, and the second signal amplitude limiter are formed as a single monolithic microwave integrated circuit (MMIC).

* * * * *